(12) United States Patent
Lin et al.

(10) Patent No.: US 7,477,125 B1
(45) Date of Patent: Jan. 13, 2009

(54) SYMMETRICAL INDUCTOR DEVICE

(75) Inventors: Hsiao-Chu Lin, Taipei County (TW);
Sheng-Yuan Lee, Taipei County (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 12/050,197

(22) Filed: Mar. 18, 2008

(30) Foreign Application Priority Data

Oct. 15, 2007 (TW) .............................. 96138465 A (51) Int. Cl.
*H01F 5/00* (2006.01)
(52) U.S. Cl. ...................................... 336/200
(58) Field of Classification Search .................. 336/65, 336/83, 200, 206–208, 232; 257/531
See application file for complete search history.

(56) References Cited

U.S. PATENT DOCUMENTS

| | | | | |
|---|---|---|---|---|
| 4,816,784 A | * | 3/1989 | Rabjohn | .................... 333/24 R |
| 6,794,977 B2 | * | 9/2004 | Christensen | ................ 336/200 |
| 6,967,555 B2 | * | 11/2005 | Yu et al. | ...................... 336/200 |
| 2005/0077992 A1 | * | 4/2005 | Raghavan et al. | ............ 336/200 |

* cited by examiner

*Primary Examiner*—Tuyen T. Nguyen
(74) *Attorney, Agent, or Firm*—Thomas, Kayden, Horstemeyer & Risley (57) ABSTRACT

A symmetrical inductor device arranged on a substrate is provided. The inductor device comprises first and second winding portions symmetrically arranged on an insulating layer on the substrate, in which each winding portion comprises first and second semi-circular conductive traces concentrically arranged from the outside to the inside, and each semi-circular conductive trace has a first end and a second end. Upper and lower cross-connections are crossly and respectively connected to the corresponding second ends of the first and second semi-circular conductive traces. First and second interconnections are respectively disposed in the insulating layer under the semi-circular conductive traces connected to both ends of the upper cross-connection, in which each interconnection comprises at least one conductive layer and a plurality of conductive plugs electrically connected between the conductive layer and the corresponding semi-circular conductive trace.

15 Claims, 9 Drawing Sheets

SYMMETRICAL INDUCTOR DEVICE

BACKGROUND OF THE INVENTION

1. Field of the Invention

The invention relates to a semiconductor device and, in particular, to a symmetrical inductor for differential operation.

2. Description of the Related Art

Many digital and analog elements and circuits have been successfully applied to semiconductor integrated circuits. Such elements may include passive components, such as resistors, capacitors, or inductors. Typically, a semiconductor integrated circuit includes a silicon substrate. One or more dielectric layers are disposed on the substrate, with one or more metal layers disposed in the dielectric layers. The metal layers may be employed to form on-chip elements, such as on-chip inductors, by current semiconductor technologies.

Figure 1:
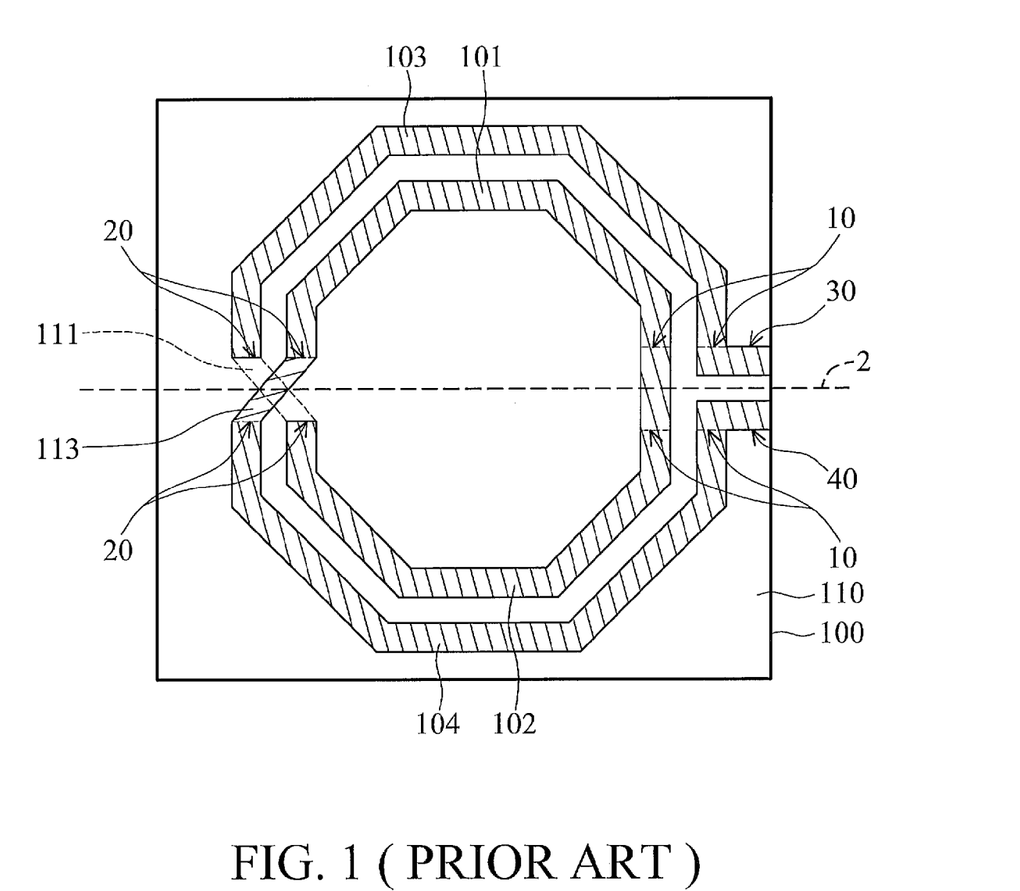
FIG. 1 is a plan view of a conventional two-turn symmetrical inductor device.

Conventionally, the on-chip inductor is formed over a semiconductor substrate and employed in integrated circuits designed for radio frequency (RF) band. FIG. 1 is a plan view of a conventional two-turn symmetrical inductor device. The inductor is formed on an insulating layer 110 on a substrate 100, comprising a first winding portion and a second winding portion symmetrical with respect to the dashed line 2 on the insulating layer 100. The first winding portion comprises semi-circular conductive traces 101 and 103 and the second winding portion comprises semi-circular conductive traces 102 and 104. The semi-circular conductive trace 103 is parallel to and located outside the semi-circular conductive trace 101. The semi-circular conductive trace 104 is parallel to and located outside the semi-circular conductive trace 102. Each semi-circular conductive trace has a first end 10 and a second end 20, in which the first end 10 of the semi-circular conductive trace 101 extends to connect the first end 10 of the semi-circular conductive trace 102.

To maintain geometric symmetry, the second end 20 of the semi-circular conductive trace 103 is electrically connected to the second end 20 of the semi-circular conductive trace 102 through a lower cross-connection (underpass) 111. Moreover, the second end 20 of the semi-circular conductive trace 104 is electrically connected to the second end 20 of the semi-circular conductive trace 101 through an upper cross-connection 113. The first ends 10 of the semi-circular conductive traces 103 and 104 have lateral extending portions 30 and 40 for inputting/outputting signals.

Currently, wireless communication chip designs frequently use differential circuits to reduce common mode noise, with inductors applied therein symmetrically. In the inductor devices shown in FIG. 1, the lower cross-connection 111 is relatively closer to the substrate 100 with respect to the upper cross-connection 113. Thus, the capacitive coupling between the lower cross-connection 111 and the substrate 100 is greater than that between the upper cross-connection 113 and the substrate 100. Moreover, since the lower cross-connection 111 is thinner than the upper cross-connection 113, the conductor loss of the lower cross-connection 111 also exceeds that of the upper cross-connection 113. As a result, such a symmetrical inductor device cannot effectively reduce common mode noise and may reduce the quality factor (Q value) in differential operation.

Thus, there exists a need in the art for an improved symmetrical inductor device design to reduce common mode noise and increase Q value.

BRIEF SUMMARY OF INVENTION

A detailed description is given in the following embodiments with reference to the accompanying drawings.

A symmetrical inductor device is provided. An embodiment of a symmetrical inductor device arranged on a substrate comprises first and second winding portions symmetrically arranged on an insulating layer on the substrate, in which each winding portion comprises first and second semi-circular conductive traces concentrically arranged from the outside to the inside, and each semi-circular conductive trace has a first end and a second end. Upper and lower cross-connections are crossly and respectively connected to the corresponding second ends of the first and second semi-circular conductive traces. First and second interconnections are respectively disposed in the insulating layer under the semi-circular conductive traces connected to both ends of the upper cross-connection, in which each interconnection comprises at least one conductive layer and a plurality of conductive plugs electrically connected between the conductive layer and the corresponding semi-circular conductive trace.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated modes of carrying out the invention. This description is provided for the purpose of illustrating the general principles of the invention and should not be taken in a limiting sense. The scope of the invention is best determined by reference to the appended claims. The symmetrical inductor device of the invention will be described in the following with reference to the accompanying drawings.

Figure 2:
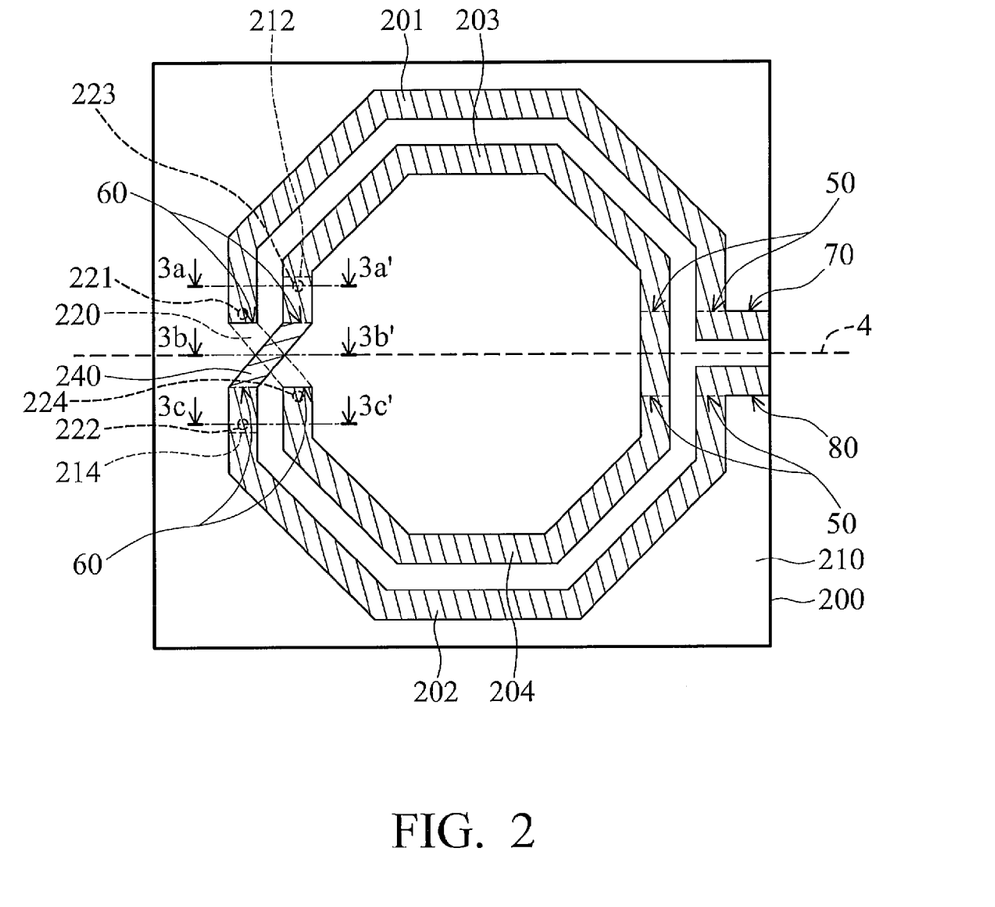
FIG. 2 is a plan view of an exemplary embodiment of a two-turn symmetrical inductor device according to the invention.
Figure 3A:
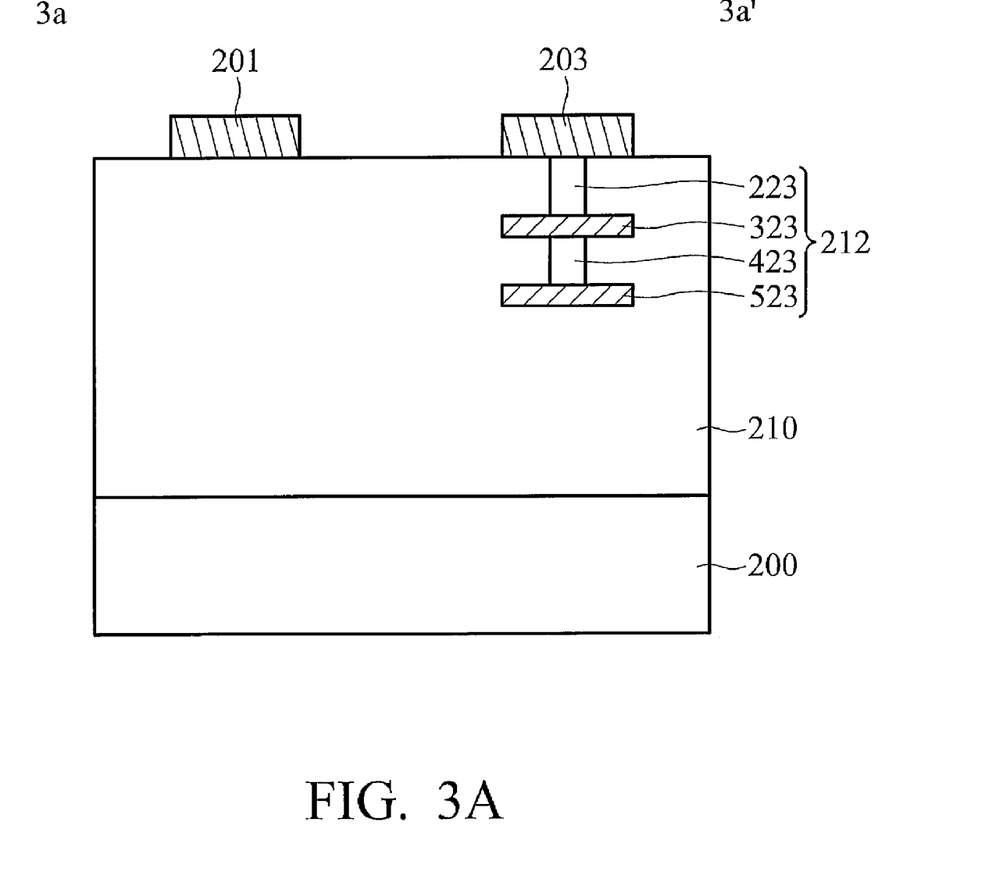
FIG. 3A shows a cross section along $3a$-$3a'$ line shown in FIG. 2.
Figure 3B:
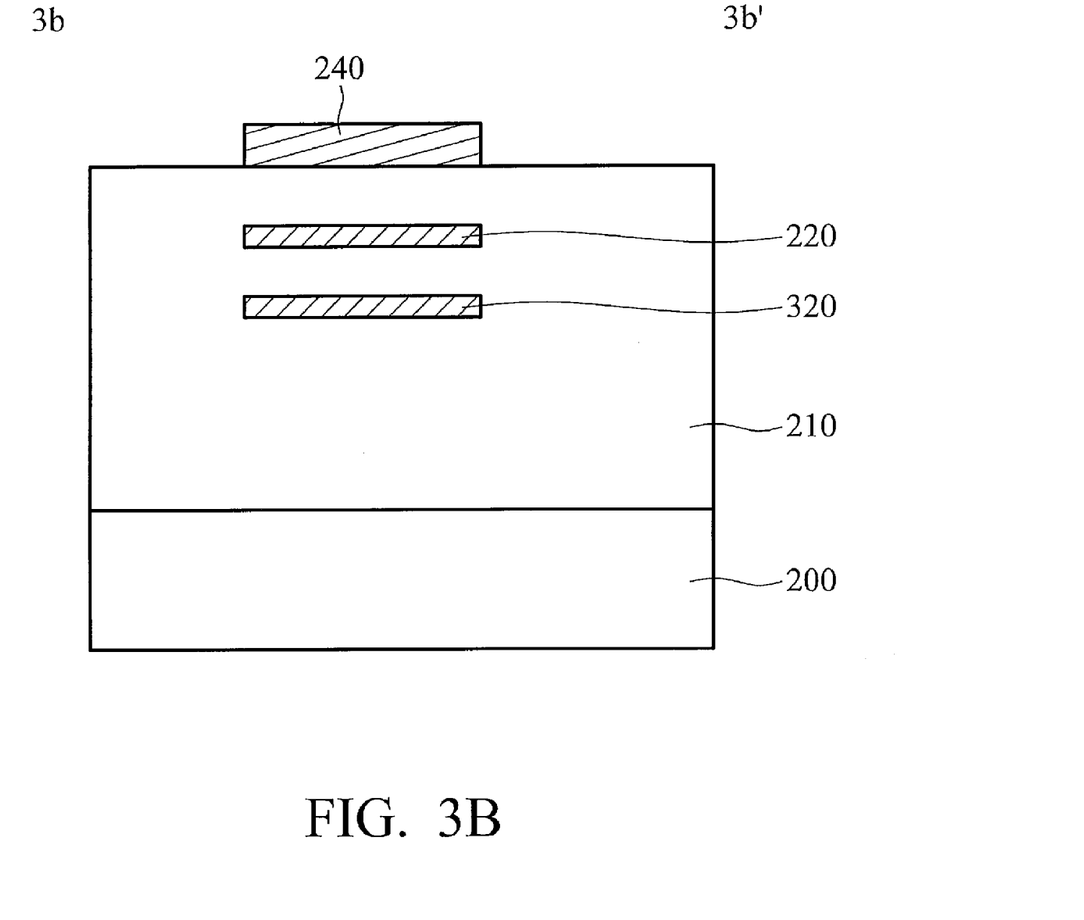
FIG. 3B shows a cross section along $3b$-$3b'$ line shown in FIG. 2.
Figure 3C:
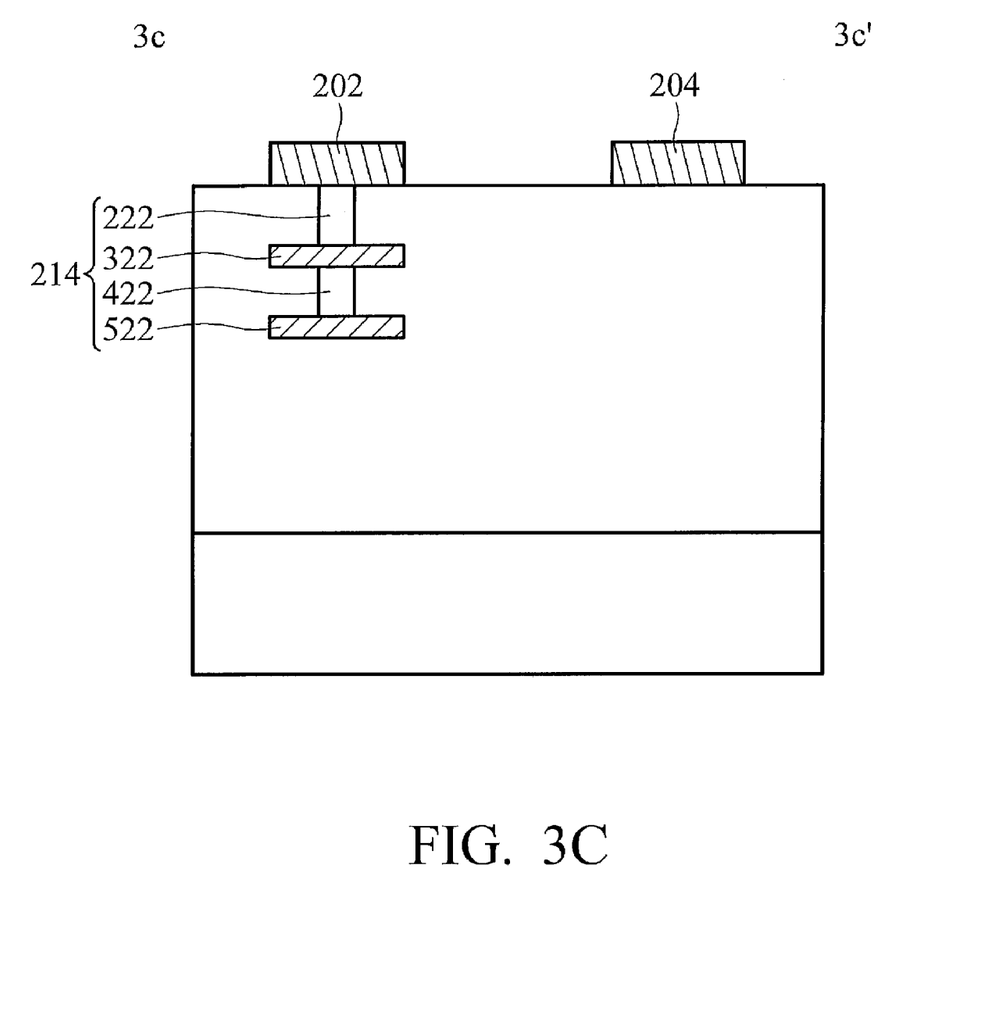
FIG. 3C shows a cross section along $3c$-$3c'$ line shown in FIG. 2.

Referring to FIGS. 2, 3A, 3B, and 3C, in which FIG. 2 is a plan view of an embodiment of a two-turn symmetrical inductor device, and FIGS. 3A to 3C show cross sections along $3a$-$3a'$, $3b$-$3b'$, and $3c$-$3c'$ lines shown in FIG. 2, respectively. The symmetrical inductor device comprises an insulating layer 210 disposed on a substrate 200, first and second winding portions, an upper cross-connection 240, a lower cross-connection 220, and interconnections 212 and 214.

The substrate 200 may include a silicon substrate or other known semiconductor substrates. The substrate 200 may include various devices, such as transistors, resistors, or other well-known semiconductor devices. Moreover, the substrate 200 may also include other conductive layers (e.g. copper, aluminum, tungsten or alloy thereof). Hereinafter, to simplify the diagrams, only a flat substrate is depicted. Additionally, the insulating layer 210 may be a single dielectric layer or multi-layer dielectrics. In the embodiment, the insulating layer 210 may be multi-layer dielectrics including silicon oxide, silicon nitride, or low-k dielectric material. Hereinafter, to simplify the diagrams, only a single dielectric layer is depicted, as shown in FIG. 3A.

As shown in FIG. 2, the first winding portion is disposed on the insulating layer 210 and located at a first side of dashed line 4. The first winding portion may comprise semi-circular conductive traces 201 and 203 arranged in concentricity from outside to inside. The second winding portion is disposed on the insulating layer 210 and located at a second side opposite to the first side of dashed line 4. The second winding portion may comprise semi-circular conductive traces 202 and 204 arranged in concentricity from outside to inside. The second winding portion and the first winding portion are symmetrical with respect to the dashed line 4. The first and second winding portions may be circular, rectangular, hexagonal, octagonal, or polygonal. To simplify the diagram, only an exemplary octagonal shape is depicted. Moreover, the first and second winding portions may comprise copper, aluminum, or alloy thereof. In the embodiment, the semi-circular conductive traces 201, 202, 203 and 204 have the same line width W and the same line space S. Moreover, each semi-circular conductive trace has a first end 50 and a second end 60. The first end 50 of the semi-circular conductive trace 203 of the first winding portion extends to the first end 50 of the semi-circular conductive trace 204 of the second winding portion for connecting together. The first ends 50 of the semi-circular conductive traces 201 and 202 have lateral extending portions 70 and 80 for inputting/outputting signals.

In the embodiment, to maintain geometric symmetry of the inductor device, a lower cross-connection 220 is disposed between the first and second winding portions for crossly connecting the second end 60 of semi-circular conductive trace 201 of the first winding portion to the second end 60 of semi-circular conductive trace 204 of the second winding portion. An upper cross-connection 240 is disposed between the first and second winding portions for crossly connecting the second end 60 of semi-circular conductive trace 203 of the first winding portion to the second end 60 of semi-circular conductive trace 202 of the second winding portion. For example, the lower cross-connection 220 is disposed in the insulating layer 210, and is electrically connected to the second ends 60 of the semi-circular conductive traces 201 and 204 by conductive plugs 221 and 224, respectively. Moreover, the upper cross-connection 240 is disposed on the insulating layer 210, and extends to the second ends 60 of the semi-circular conductive traces 202 and 203 for electrical connection. In another embodiment, the lower cross-connection 220 may be electrically connected to the second ends 60 of the semi-circular conductive traces 202 and 203 by conductive plugs. The upper cross-connection 240 may extend to the second ends 60 of the semi-circular conductive traces 201 and 204 for electrical connection. Note that the lower cross-connection 220 induces larger conductor loss than the upper cross-connection 240 and results in reduction of Q value because the lower cross-connection 220 is thinner than the upper cross-connection 240. Accordingly, an additional interconnection under the lower cross-connection 220 may be electrically connected thereto in parallel for reduction of conductor loss caused by the lower cross-connection 220. The interconnection is disposed in the insulating layer 210 under the lower cross-connection 220, comprising a conductive layer 320 and a plurality of conductive plugs electrically connected between the conductive layer 320 and the lower cross-connection 220. For example, two conductive plugs (not shown) are respectively disposed in the insulating layer 210 between the conductive layer 320 and the lower cross-connection 220 and are substantially aligned to the conductive plugs 221 and 224 (which are shown in FIG. 2), respectively. In another embodiment, such an interconnection may comprise stacking conductive layers which are electrically connected together.

Moreover, as shown in FIG. 2, the semi-circular conductive traces 203 and 202, connected to both ends of the upper cross-connection 240, are electrically connected to the underlying interconnections 212 and 214 in parallel, respectively, in which the interconnections 212 and 214 in the insulating layer 210 may respectively comprise at least one conductive layer and a plurality of conductive plugs electrically connected between the conductive layer and the corresponding semi-circular conductive trace. For example, the interconnection 212 comprises stacking conductive layers 323 and 523 and conductive plugs 223 and 423, as shown in FIG. 3A. The interconnection 214 comprises stacking conductive layers 322 and 522 and conductive plugs 222 and 422, as shown in FIG. 3C. Note that the number of the conductive layers in the interconnections 212 and 214 are based on design demand. Additionally, the total number of the lower cross-connection 220 and the conductive layers of the underlying interconnection are the same as that of the conductive layers of the interconnection 212 and the same as that of the conductive layers of the interconnection 214. In other words, the closest conductive layer under the lower cross-connection 220 to the substrate 200 (for example, the conductive layer 320 shown in FIG. 3B) is located at the same level as the closest conductive layers of the interconnections 212 and 214 to the substrate 200 (for example, the conductive layer 523 shown in FIG. 3A and the conductive layer 522 shown in FIG. 3C). In another embodiment, as there are no interconnections disposed under the lower cross-connection 220, the lower cross-connection 220 is located at the same level as the closest conductive layers of the interconnections 212 and 214 to the substrate 200.

Although the capacitive coupling between the lower cross-connection 220 and the substrate 200 is larger than that between the upper cross-connection 240 and the substrate 200, the interconnections 212 and 214 near both ends of the upper cross-connection 240 may increase the capacitive coupling between the substrate 200 and the semi-circular conductive traces 203 and 202, and results in a similar capacitive coupling as that between the substrate 200 and the semi-circular conductive traces 201 and 204. As a result, the inductor device according to the embodiment can effectively reduce the common mode noise and increase Q value in differential operation.

Figure 4:
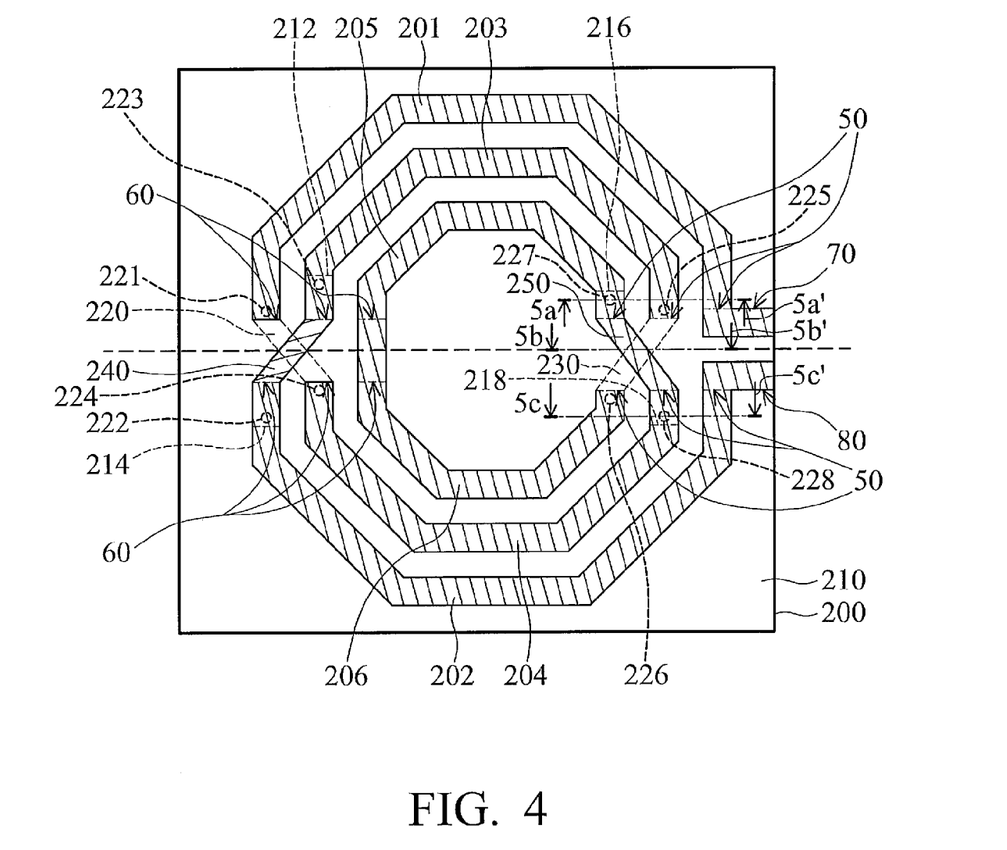
FIG. 4 is a plan view of an exemplary embodiment of a three-turn symmetrical inductor device according to the invention.
Figure 5A:
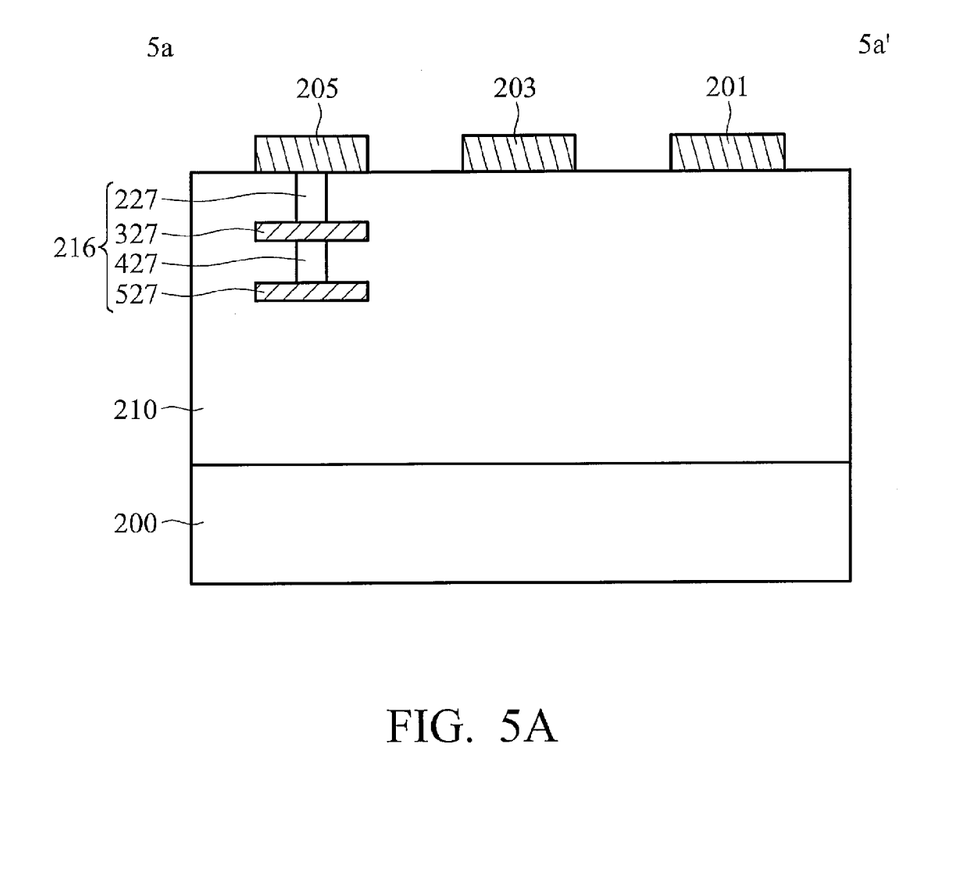
FIG. 5A shows a cross section along $5a$-$5a'$ line shown in FIG. 4.
Figure 5B:
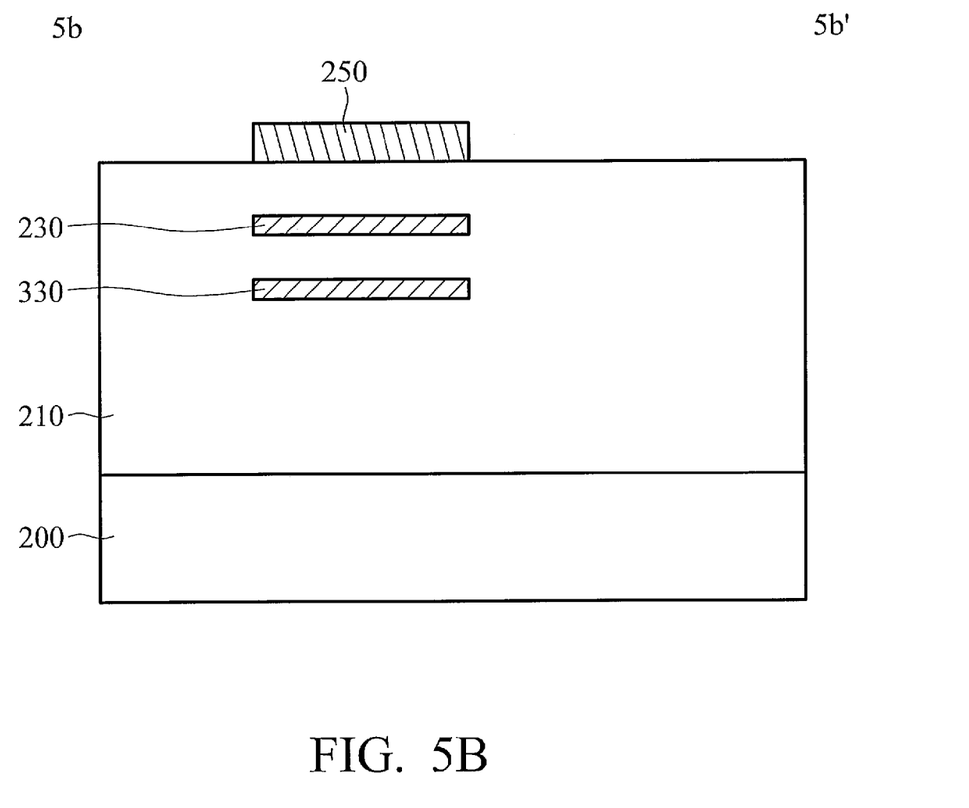
FIG. 5B shows a cross section along $5b$-$5b'$ line shown in FIG. 4.
Figure 5C:
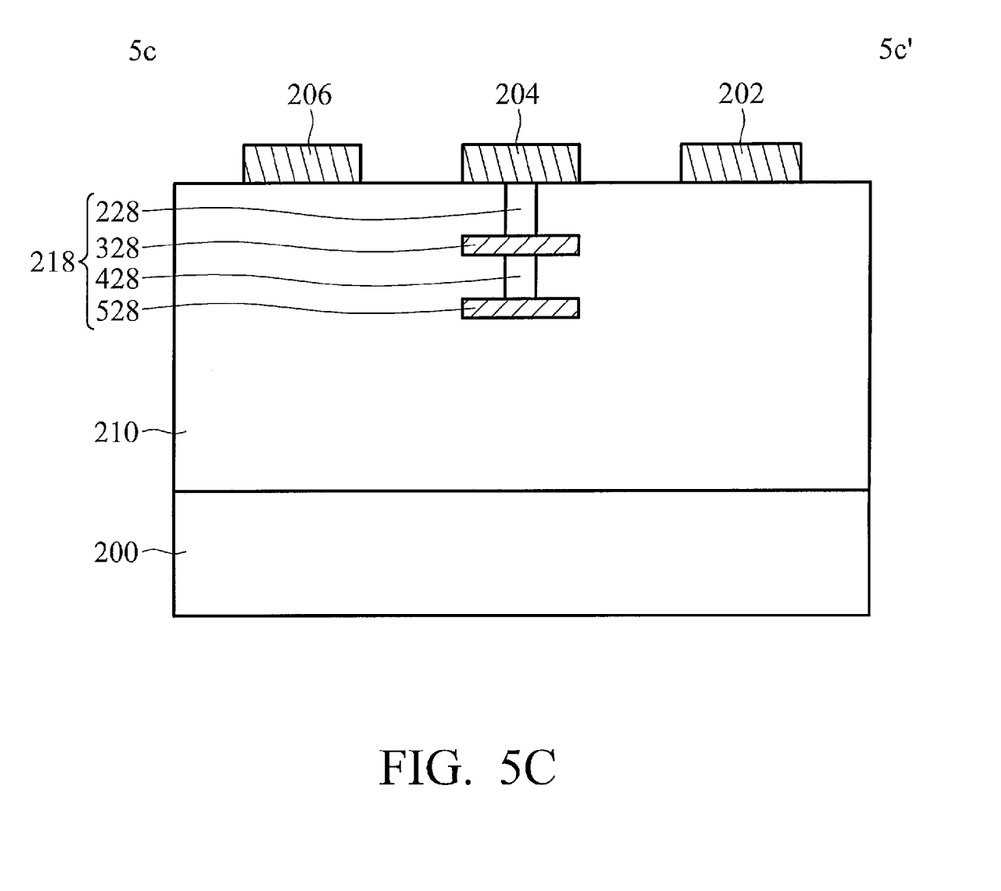
FIG. 5C shows a cross section along $5c$-$5c'$ line shown in FIG. 4.

Referring to FIGS. 4, 5A, 5B, and 5C, in which FIG. 4 is a plan view of an embodiment of a three-turn symmetrical inductor device, and FIGS. 5A to 5C show cross sections along 5a-5a', 5b-5b', and 5c-5c' lines shown in FIG. 4, respectively. The elements in FIGS. 4, 5A, 5B, and 5C that are the same as those in FIGS. 2, 3A, 3B, and 3C are labeled with the same reference numbers as in FIGS. 2, 3A, 3B, and 3C and are not described again for brevity. In this embodiment, the first winding portion may comprise semi-circular conductive traces 201, 203, and 205 arranged in concentricity from outside to inside. The second winding portion may comprise semi-circular conductive traces 202, 204, and 206 arranged in concentricity from outside to inside. Each semi-circular conductive trace has a first end 50 and a second end 60. The second end 60 of the semi-circular conductive trace 205 of the first winding portion extends to the second end 60 of the semi-circular conductive trace 206 of the second winding portion for connecting together.

In the embodiment, besides the upper cross-connection 240 and the lower cross-connection 220 crossly and respectively connecting the second ends 60 of semi-circular conductive traces 203 and 201 of the first winding portion to the second ends 60 of semi-circular conductive traces 202 and 204 of the second winding portion, the inductor device further comprises an upper cross-connection 250 and a lower cross-connection 230 crossly and respectively connecting the first ends 50 of semi-circular conductive traces 205 and 203 of the first winding portion to the first ends 50 of semi-circular conductive traces 204 and 206 of the second winding portion. For example, the lower cross-connection 230 is electrically connected to the first ends 50 of the semi-circular conductive traces 203 and 206 by conductive plugs 225 and 226, respectively. Moreover, the upper cross-connection 250 extends to the first ends 50 of the semi-circular conductive traces 205 and 204 for electrical connection. In another embodiment, the lower cross-connection 230 may be electrically connected to the first ends 50 of the semi-circular conductive traces 205 and 204 by conductive plugs. The upper cross-connection 250 may extend to the first ends 50 of the semi-circular conductive traces 203 and 206 for electrical connection.

As shown in FIG. 5A, an additional interconnection under the lower cross-connection 230 may be electrically connected thereto in parallel for reduction of conductor loss caused by the lower cross-connection 230. The interconnection is disposed in the insulating layer 210 under the lower cross-connection 230, comprising a conductive layer 330 and a plurality of conductive plugs electrically connected between the conductive layer 330 and the lower cross-connection 230. For example, two conductive plugs (not shown) are respectively disposed in the insulating layer 210 between the conductive layer 330 and the lower cross-connection 230 and are substantially aligned to the conductive plugs 225 and 226 (which are shown in FIG. 4), respectively. In another embodiment, such an interconnection may comprise stacking conductive layers which are electrically connected together.

Moreover, as shown in FIG. 4, the semi-circular conductive traces 205 and 204 where are connected to both ends of the upper cross-connection 250 are electrically connected to the underlying interconnections 216 and 218 in parallel, respectively, in which the interconnections 216 and 218 in the insulating layer 210 may respectively comprise at least one conductive layer and a plurality of conductive plugs electrically connected between the conductive layer and the corresponding semi-circular conductive trace. For example, the interconnection 216 comprises stacking conductive layers 327 and 527 and conductive plugs 227 and 427, as shown in FIG. 5A. The interconnection 218 comprises stacking conductive layers 328 and 528 and conductive plugs 228 and 428, as shown in FIG. 5C. Additionally, in the embodiment, the total number of the lower cross-connection 230 and the conductive layers of the underlying interconnection are the same as that of the conductive layers of the interconnection 216 and the same as that of the conductive layers of the interconnection 218. In other words, the closest conductive layer under the lower cross-connection 230 to the substrate 200 (for example, the conductive layer 330 shown in FIG. 5B) is located at the same level as the closest conductive layers of the interconnections 216 and 218 to the substrate 200 (for example, the conductive layer 527 shown in FIG. 5A and the conductive layer 528 shown in FIG. 5C). In another embodiment, as there are no interconnections disposed under the lower cross-connection 230, the lower cross-connection 230 is located at the same level as the closest conductive layers of the interconnections 216 and 218 to the substrate 200.

The interconnections 216 and 218 near both ends of the upper cross-connection 250 may increase the capacitive coupling between the substrate 200 and the semi-circular conductive traces 205 and 204, and results in a similar capacitive coupling as that between the substrate 200 and the semi-circular conductive traces 203 and 206, thereby effectively reducing the common mode noise and increasing Q value in differential operation.

Additionally, it is to be noted that the invention is not limited to two-turn and three-turn symmetrical inductor devices, as the embodiments described above. Other multi-turn symmetrical inductor devices may also be applied to provide the advantages as set forth previously.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A symmetrical inductor device arranged on a substrate, comprising:

an insulating layer;

first and second winding portions symmetrically arranged on the insulating layer, wherein each winding portion comprises first and second semi-circular conductive traces concentrically arranged from the outside to the inside, and each semi-circular conductive trace has a first end and a second end;

a first upper cross-connection and a first lower cross-connection crossly and respectively connected to the corresponding second ends of the first and second semi-circular conductive traces; and first and second interconnections respectively disposed in the insulating layer under the semi-circular conductive traces connected to both ends of the first upper cross-connection, wherein each interconnection comprises at least one conductive layer and a plurality of conductive plugs electrically connected between the conductive layer and the corresponding semi-circular conductive trace.

2. The symmetrical inductor device as claimed in claim 1, wherein the first ends of the second semi-circular conductive traces are connected together.

3. The symmetrical inductor device as claimed in claim 1, wherein the first and second winding portions are circular, rectangular, hexagonal, octagonal, or polygonal.

4. The symmetrical inductor device as claimed in claim 1, further comprising a third interconnection disposed in the insulating layer under the first lower cross-connection, wherein the third interconnection comprises at least one conductive layer and a plurality of conductive plugs electrically connected between the conductive layer and the first lower cross-connection.

5. The symmetrical inductor device as claimed in claim 4, wherein the first, second, and third interconnections respectively comprise a plurality of conductive layers and the total number of the first lower cross-connection and the conductive layers of the third interconnection are the same as that of the conductive layers of the first interconnection and the same as that of the conductive layers of the second interconnection.

6. The symmetrical inductor device as claimed in claim 5, wherein the closest conductive layer of the third interconnection to the substrate is located at the same level as the closest conductive layers of the first and second interconnections to the substrate.

7. The symmetrical inductor device as claimed in claim 1, wherein the first lower cross-connection is located at the same level as the closest conductive layers of the first and second interconnections to the substrate.

8. The symmetrical inductor device as claimed in claim 1, wherein each winding portion further comprises a third semi-circular conductive trace concentrically arranged inside the second semi-circular conductive trace.

9. The symmetrical inductor device as claimed in claim 8, wherein the second ends of the third semi-circular conductive traces are connected together.

10. The symmetrical inductor device as claimed in claim 8, further comprising a second upper cross-connection and a second lower cross-connection crossly and respectively connected to the corresponding first ends of the second and third semi-circular conductive traces.

11. The symmetrical inductor device as claimed in claim 10, further comprising third and fourth interconnections respectively disposed in the insulating layer under the semi-circular conductive traces connected to both ends of the second upper cross-connection, wherein the third and fourth interconnections respectively comprise at least one conductive layer and a plurality of conductive plugs electrically connected between the conductive layer and the corresponding semi-circular conductive trace.

12. The symmetrical inductor device as claimed in claim 11, wherein the second lower cross-connection is located at the same level as the closest conductive layers of the third and fourth interconnections to the substrate.

13. The symmetrical inductor device as claimed in claim 11, further comprising a fifth interconnection disposed in the insulating layer under the second lower cross-connection, wherein the fifth interconnection comprises at least one conductive layer and a plurality of conductive plugs electrically connected between the conductive layer and the second lower cross-connection.

14. The symmetrical inductor device as claimed in claim 13, wherein the third, fourth, and fifth interconnections respectively comprise a plurality of conductive layers and the total number of the second lower cross-connection and the conductive layers of the fifth interconnection are the same as that of the conductive layers of the third interconnection and the same as that of the conductive layers of the fourth interconnection.

15. The symmetrical inductor device as claimed in claim 14, wherein the closest conductive layer of the fifth interconnection to the substrate is located at the same level as the closest conductive layers of the third and fourth interconnections to the substrate.

* * * * *